(12) United States Patent
Hanamaki

(10) Patent No.: US 7,075,119 B2
(45) Date of Patent: Jul. 11, 2006

(54) OPTICAL SEMICONDUCTOR DEVICE AND METHOD OF FABRICATING OPTICAL SEMICONDUCTOR DEVICE

(75) Inventor: Yoshihiko Hanamaki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/135,323

(22) Filed: May 24, 2005

(65) Prior Publication Data

US 2006/0054916 A1 Mar. 16, 2006

(30) Foreign Application Priority Data

Sep. 14, 2004 (JP) ............... 2004-267033

(51) Int. Cl.
*H01L 33/00* (2006.01)
(52) U.S. Cl. ............ 257/102; 257/79; 257/E33.001; 438/22; 438/45
(58) Field of Classification Search ............ None
See application file for complete search history.

(56) References Cited

U.S. PATENT DOCUMENTS 5,814,534 A 9/1998 Kimura et al.

6,911,713 B1* 6/2005 Ikeda et al.

FOREIGN PATENT DOCUMENTS

JP 6-37392 2/1994
JP 8-102567 4/1996

OTHER PUBLICATIONS

Matsuyuki Ogasawara et al., "Correlation between Fe-Zn Interdiffusion Observed by Scanning Capacitance Microscopy and Device Characteristics of Electro-Absorption Modulators", Jpn. J. Appl. Phys. vol. 42 (2003) pp. 2320-2324, Part 1, No. 4B, Apr. 2003.

* cited by examiner

*Primary Examiner*—Nathan J. Flynn
*Assistant Examiner*—Kevin Quinto
(74) *Attorney, Agent, or Firm*—Leydig, Voit & Mayer, Ltd.

(57) ABSTRACT

In an optical semiconductor device including, at least, an n-type semiconductor layer having n-type conductivity, an active layer, a p-type semiconductor layer having p-type conductivity, current blocking layers doped with Fe are located on opposite sides of the p-type semiconductor layer. Fe and Be are simultaneously supplied as dopants when forming the p-type semiconductor layer. In this event, the flow rates of source materials supplying the respective elements are adjusted so that the p-type semiconductor layer has a hole concentration of about $1.0 \times 10^{18}/cm^3$ and an Fe concentration of about $2 \times 10^{16}$ to $8 \times 10^{16}/cm^3$.

7 Claims, 6 Drawing Sheets

OPTICAL SEMICONDUCTOR DEVICE AND METHOD OF FABRICATING OPTICAL SEMICONDUCTOR DEVICE

BACKGROUND OF THE INVENTION

1. Field of the Invention

The present invention relates to an optical semiconductor device and a method of fabricating an optical semiconductor device and, more specifically, relates to an optical semiconductor device using Be as a p-type dopant, and Fe as a dopant for making current blocking layers highly resistive and a method of fabricating such an optical semiconductor device.

2. Description of the Related Art

In recent years, the amount of information handled by information communication devices has become enormous and, particularly in the field of optical communications, there has been increasing need for semiconductor light-emitting devices. (semiconductor laser, modulator, laser with modulator, etc.) enabling ultra-high-speed modulation exceeding 40 GHz and ultra-high-speed semiconductor light-receiving devices (photodiode etc.) exceeding 80 GHz for receiving modulated lights coming from light-emitting devices through optical transmission lines.

Such a semiconductor light-emitting device or semiconductor light-receiving device (hereinafter collectively referred to as an "optical semiconductor device") comprises, in addition to electrodes, a semiconductor having a p-type or n-type conductivity for supplying the power to the device. Further, in order to enable high-speed modulation exceeding 40 GHz, it is necessary to reduce the device resistance or capacitance. For this purpose, there has been adopted a method of limiting a region where current as a feed to the device flows, such as providing Fe—InP current blocking layers in the optical semiconductor device.

The Fe—InP current blocking layers are usually disposed on both sides of the p-type semiconductor of the optical semiconductor device so as to be in contact with the p-type semiconductor. In the case of such a structure, however, it is easy to occur that Fe of the Fe—InP current blocking layers may interdiffuse with the p-type dopant (e.g. Zn, Be, or Mg) of the p-type semiconductor. When the interdiffusion occurs between Fe and the p-type dopant as described above, the resistance of each Fe—InP current blocking layer decreases near an interface between itself and the p-type semiconductor. In this case, there arises a problem that the function of the Fe—InP current blocking layers, such that the region where the current flows is limited by providing the highly resistive Fe—InP current blocking layers on both sides of the p-type semiconductor, is not efficiently achieved.

In view of this, as a countermeasure, there are considered methods each for preventing Fe from interdiffusing with the p-type dopant of the p-type semiconductor.

As one of such methods, there is, for example, the method of doping Fe, simultaneously with the p-type dopant, into a p-type semiconductor contacting Fe—InP current blocking layers (e.g. see Japanese Patent No. 3257045).

Further, there is the method of employing Ru—InP current blocking layers instead of Fe—InP current blocking layers (e.g. see Jpn. J. Appl. Phys. vol. 42 (2003), pp. 2320–2324).

As a p-type dopant doped into a p-type semiconductor, Zn is often used particularly in the MOCVD (Metal-Organic Chemical Vapor Deposition) method. However, since the diffusion coefficient of Zn is relatively large, Zn may diffuse into an active layer. In view of this, there is concern that the luminous efficiency of a semiconductor laser is lowered and therefore a suggestion has been proposed using, instead of Zn, a material having a small diffusion coefficient such as Be (e.g. see JP-A-H08-102567).

However, when Be is used as a dopant of a p-type semiconductor, even if attempting to dope Be and Fe simultaneously, doping delay may occur with respect to Be. Therefore, it is considered to be difficult to simultaneously dope Fe and Be into a semiconductor by the use of the conventional method.

SUMMARY OF THE INVENTION

It is therefore an object of the present invention to solve the foregoing problems and provide an optical semiconductor device fabrication method using a method of simultaneously doping Be and Fe into a semiconductor, and further provide an optical semiconductor device doped with Be and Fe at required concentrations while interdiffusion between Fe of current blocking layers and Be in a p-type semiconductor is suppressed.

According to one aspect of the present invention, an optical semiconductor device comprises, at least, an n-type semiconductor layer having an n-type conductivity, an active layer formed on said n-type conductivity, a p-type semiconductor layer having a p-type conductivity and formed on said active layer, and current blocking layers doped with Fe and formed on both sides of said p-type semiconductor layer. The p-type semiconductor layer is doped with Fe and Be and has a hole concentration of $0.7 \times 10^{18}/cm^3$ to $1.3 \times 10^{18}/cm^3$ and an Fe element concentration of $2 \times 10^{16}/cm^3$ to $8 \times 10^{16}/cm^3$.

According to another aspect of the present invention, in an optical semiconductor device fabrication method, an n-type semiconductor layer is formed on a substrate. An active layer is formed on said n-type semiconductor layer. A p-type semiconductor layer doped with Fe and Be is formed on said active layer. A current blocking layer is formed on both sides of said p-type semiconductor layer. When growing a layer included in said p-type semiconductor layer, Be elements as a p-type dopant and Fe elements are simultaneously doped. Here, a supply amount of a material for doping Be elements are set more than an amount that can cause a hole concentration of said p-type semiconductor layer to be predetermined concentration when said material for doping Be elements is doped alone.

Other and further objects, features and advantages of the invention will appear more fully from the following description.

DESCRIPTION OF THE PREFERRED EMBODIMENT

Hereinbelow, preferred embodiments of the present invention will be described with reference to the drawings. The same or corresponding portions are assigned the same symbols in respective figures to thereby simplify or omit explanation thereof.

When numerical values such as the numbers, quantities, magnitudes, ranges, and the like of components are referred to in the following embodiments, the present invention is not limited to those numerical values except when clearly expressed otherwise or obviously limited to those numerical values in terms of principles. Further, with respect to structures, steps in methods, and the like described in the embodiments, those are not necessarily essential in the present invention except when clearly expressed otherwise or obviously specified to them in terms of principles.

First, an outline of the present invention in the following embodiments will be described.

Figure 1:
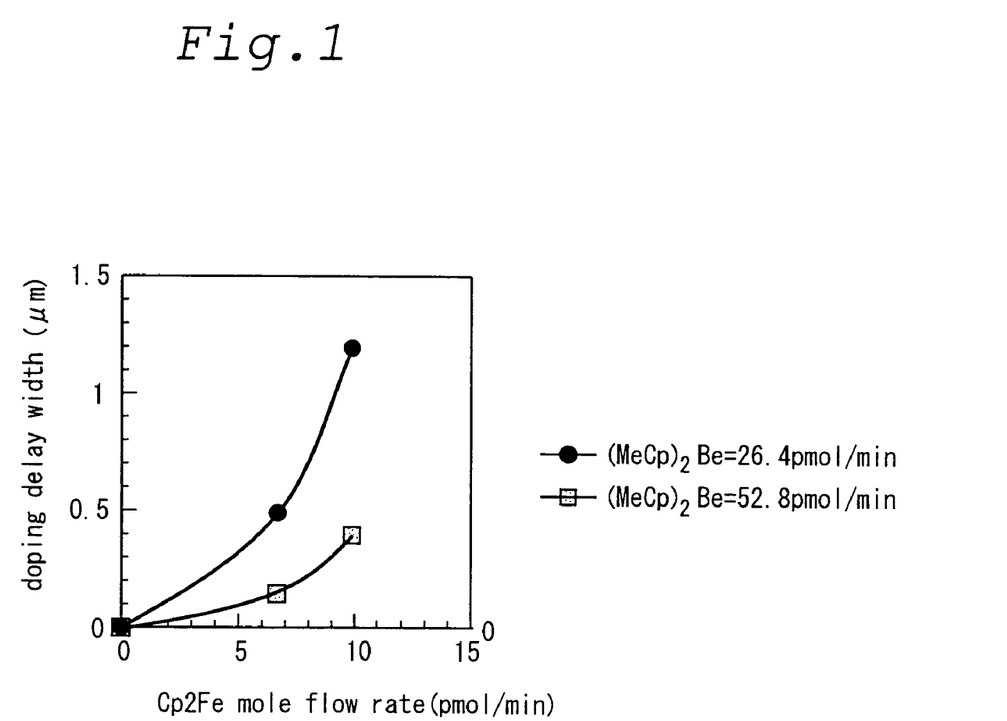
FIG. 1 is a graph showing a doping delay width of Be when Fe and Be are simultaneously doped.

FIG. 1 is a graph showing a doping delay width of Be when Fe and Be are simultaneously doped. The ordinate represents doping delay width (μm) and the abscissa represents $Cp_2Fe$ mole flow rate (pmol/min).

Figure 2A:
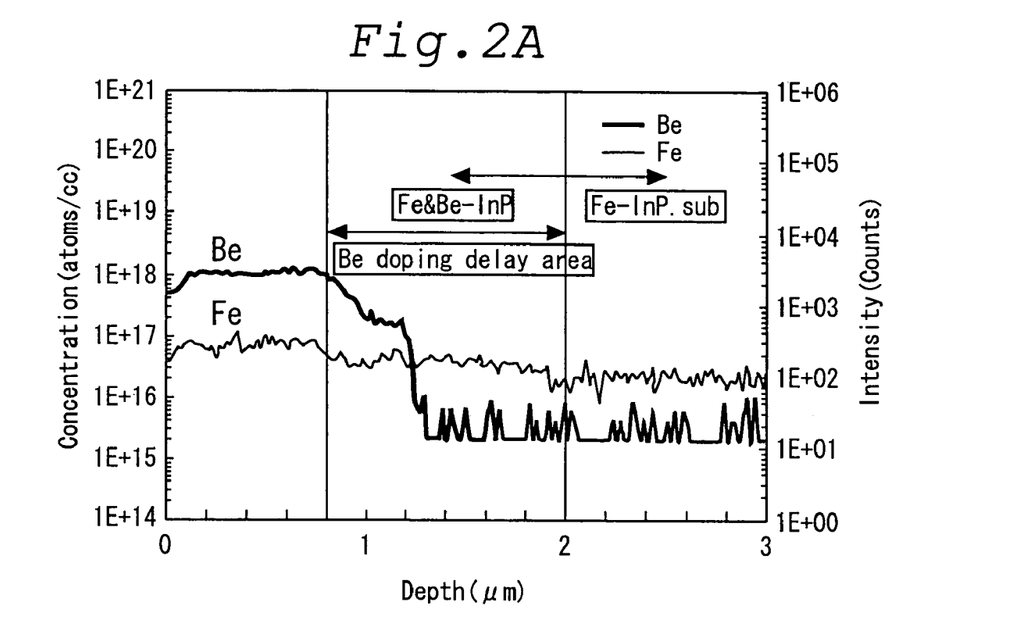
FIG. 2A is a graph showing concentration distributions of Fe and Be when Fe and Be are simultaneously doped.
Figure 2B:
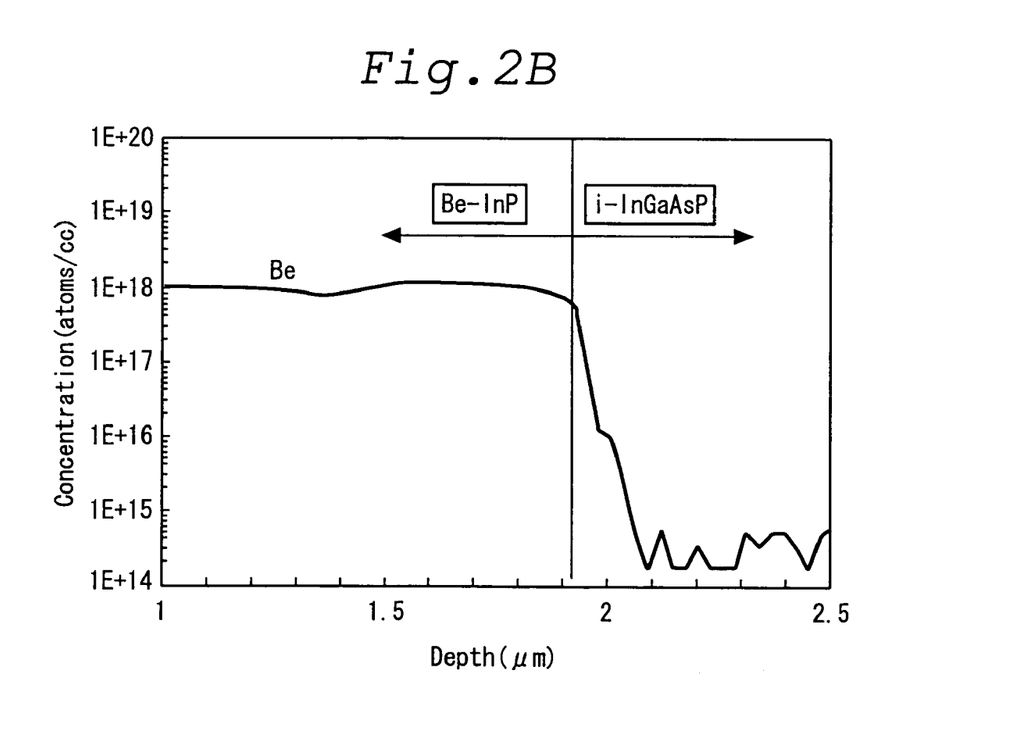
FIG. 2B is a graph showing a concentration distribution of Be when only Be is doped.

FIGS. 2A and 2B are graphs showing concentration distributions of Be and Fe, wherein FIG. 2A shows a case where Fe and Be are simultaneously doped while FIG. 2B shows a case where only Be is doped. In FIGS. 2A and 2B, the ordinate represents concentration (atmos/cc) and the abscissa represents depth (μm) from the surface.

Figure 3A:
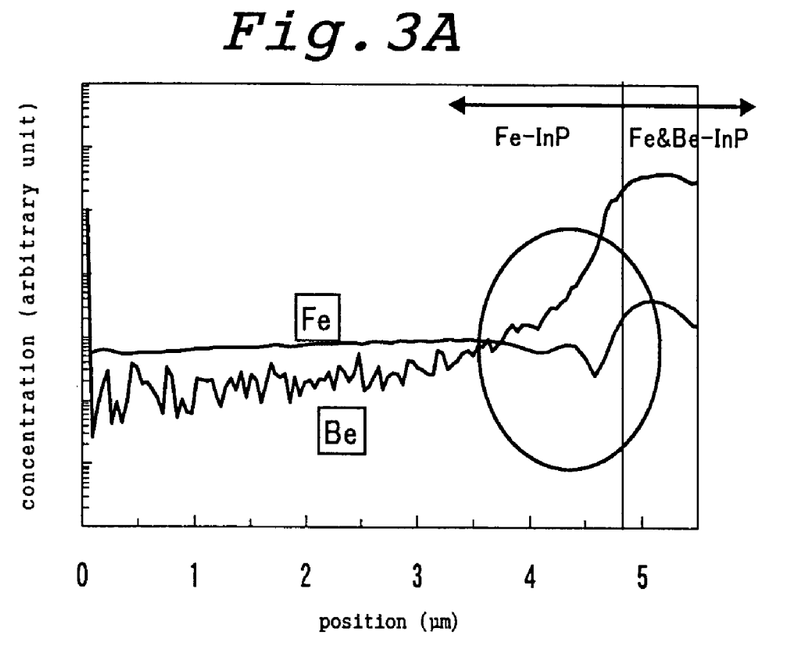
FIG. 3A is a graph for explaining the state of interdiffusion when Fe and Be are simultaneously doped.
Figure 3B:
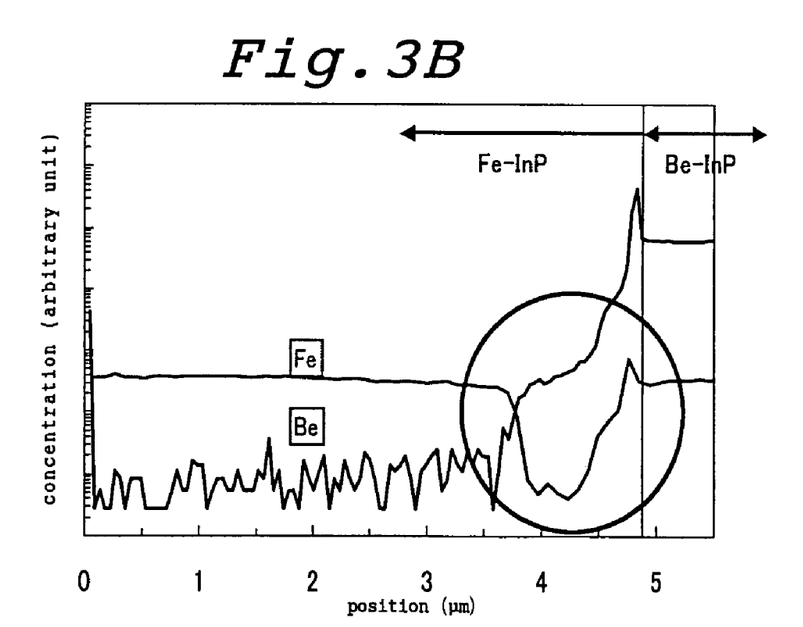
FIG. 3B is a graph for explaining the state of interdiffusion when only Be is doped.

FIGS. 3A and 3B are graphs for explaining the state of interdiffusion when Fe and Be are simultaneously doped and the state of interdiffusion when only Be is doped, wherein FIG. 3A shows the case where Fe and Be are simultaneously doped while FIG. 3B shows the case where only Be is doped. In FIGS. 3A and 3B, the ordinate represents concentration (arbitrary unit) and the abscissa represents position (μm) from the surface.

In the doping of FIG. 1, $(MeCp)_2Be$ $(Be(CH_3C_5H_4)_2$; bis-methyl-cyclopenta-dienyl-beryllium) is used as a organometallic source material for Be doping, and $Cp_2Fe$ (Fe$(C_5H_5)_2$; bis-cyclopenta-dienyl-iron) is used as an organometallic source material for Fe doping. In the graph of FIG. 1, a curve plotted by dots of black circles represents a case where the flow rate of $(MeCp)_2Be$ is 26.4 pmol/min and a curve plotted by dots of black squares represents a case where the flow rate of $(MeCp)_2Be$ is 52.8 pmol/min. These flow rates are such amounts that cause the hole concentrations to be $1\times10^{18}/cm^3$ and $2\times10^{18}/cm^3$, respectively, when Be is doped alone into InP. Further, the conditions of forming an InP film, into which Be is doped, according to the MOCVD (Metal-Organic Chemical Vapor Deposition) method are such that the temperature is about 600° C., the film formation pressure about 100 mbar, the film growth rate about 2.5 μm/h, and the V/III ratio 40. Concerning Fe doping into InP, in the case of the flow rate of 10 pmol/min, Fe exists in crystal in an amount of $1.2\times10^{17}/cm^3$, while, in the case of the flow rate of 6.5 pmol/min, Fe exists in crystal in an amount of $8.0\times10^{16}/cm^3$.

As seen from FIG. 1, regardless of the magnitude of a supply amount of $(MeCp)_2Be$, the doping delay width of Be increases as the mole flow rate of $Cp_2Fe$ increases. That is, if Be and Fe are simultaneously doped, Be is inevitably subjected to occurrence of doping delay.

Further, it is understood from FIGS. 2A and 2B that doping delay does not occur when only Be is doped into InP, while, when Fe and Be are simultaneously doped, a doping delay region of Be is generated at a depth of about 0.8 to 2.0 μm and, in particular, Be is not doped at all at a depth of about 1.3 to 2.0 μm.

However, as shown in FIG. 1, the inventor has found that the doping delay width of Be decreases as the supply amount of $(MeCp)_2Be$ increases.

Therefore, in the present invention, utilizing this fact, the simultaneous doping is carried out by controlling the flow rate of $(MeCp)_2Be$ so as to suppress the amount of the doping delay of Be within a range that does not adversely affect operation characteristics of an optical semiconductor device.

Simultaneously, the inventor has found that when Fe exists in the InP layer in advance, interdiffusion between Be and Fe is suppressed. That is, in the embodiments, by simultaneously doping Be and Fe, the interdiffusion can be suppressed simultaneously. This will be explained using FIGS. 3A and 3B.

In FIGS. 3A and 3B, the flow rate of $(MeCp)_2Be$ is set to 52.8 pmol/min and the flow rate of $Cp_2Fe$ is set to 6.5 pmol/min. Further, like in the case of FIG. 1, the conditions of forming an InP film, into which Be is doped, according to the MOCVD method are such that the temperature is about 600° C., the film formation pressure about 100 mbar, and the film growth rate about 2.5 μm/h.

As shown in FIG. 3B, when only Be is doped, interdiffusion occurs between an Fe—InP layer and a Be—InP layer so that a depletion layer with a width of about 1.5 μm is generated in the Fe—InP layer near the boundary with the Be—InP layer.

However, as shown in FIG. 3A, when Fe and Be are simultaneously doped, no depletion layer is generated even near this boundary. That is, since Fe exists in the InP layer by simultaneously doping Fe and Be, it is possible to suppress interdiffusion between the Fe—InP layer and the Fe&Be—InP layer.

Therefore, in the embodiments of the present invention as will be described hereinbelow, the simultaneous doping is performed while suppressing the doping delay of Be, and simultaneously, interdiffusion between Fe of current blocking layers and Be of a semiconductor can be suppressed.

First Embodiment

Figure 4:
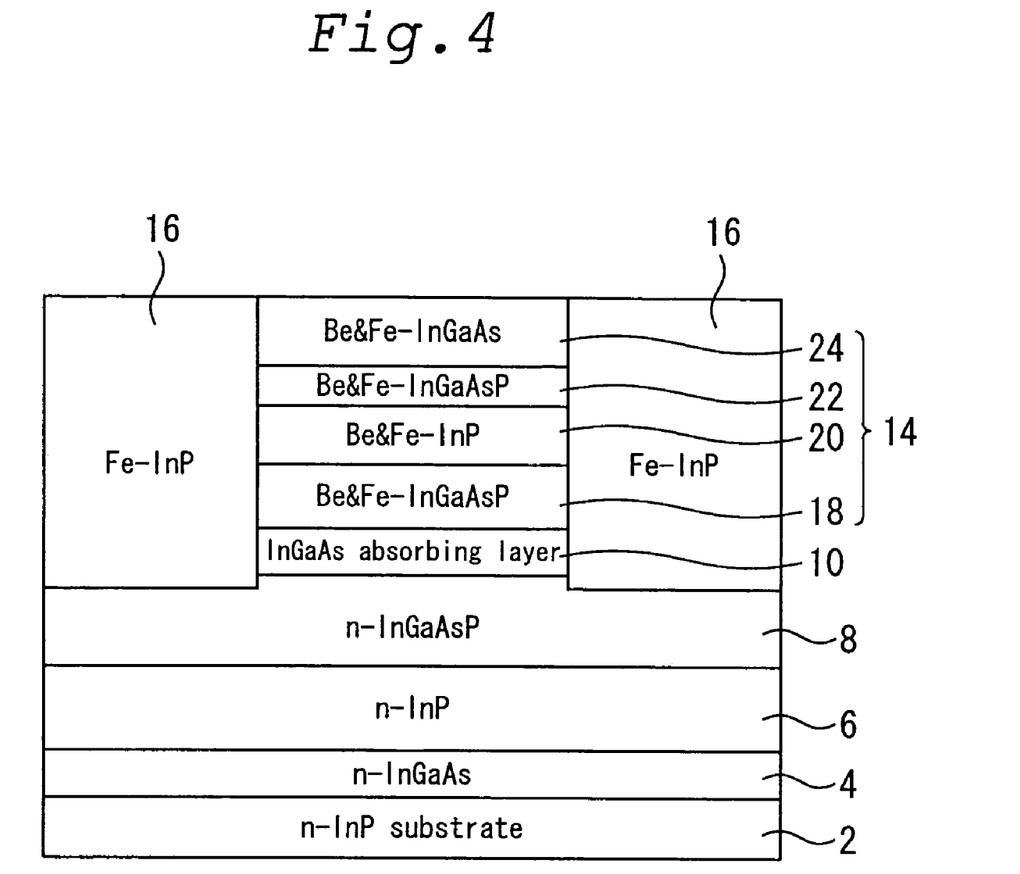
FIG. 4 is an exemplary diagram for explaining an optical semiconductor device in a first preferred embodiment of the present invention.

FIG. 4 is an exemplary diagram for explaining an optical semiconductor device in the first embodiment of the present invention.

As shown in FIG. 4, in the optical semiconductor device of the first embodiment, on an n-InP substrate 2, an n-InGaAs layer 4, an n-InP layer 6, and an n-InGaAsP layer 8 are stacked in the order named from below. The thicknesses of the n-InGaAs layer 4, the n-InP layer 6, and the n-InGaAsP layer 8 are 500 nm, 1500 nm, and 800 nm, respectively.

Further, on the n-InGaAsP layer 8, an undoped InGaAs light absorbing layer 10 is formed as an active layer. The thickness of the InGaAs light absorbing layer 10 is about 400 nm.

A p-type contact layer 14 is formed on the InGaAs light absorbing layer 10. On both sides of the contact layer 14, Fe—InP current blocking layers 16 are formed. The Fe—InP current blocking layers 16 are highly resistive layers formed for limiting current that flows in the contact layer 14 and each have a thickness of about 2500 nm.

The contact layer 14 is configured such that a Be&Fe—InGaAsP layer 18, a Be&Fe—InP layer 20, a Be&Fe—InGaAsP layer 22, and a Be&Fe—InGaAs layer 24 are stacked on the InGaAs light absorbing layer 10, in the order named from below. The thicknesses of the Be&Fe—InGaAsP layer 18, the Be&Fe—InP layer 20, the Be&Fe—InGaAsP layer 22, and the Be&Fe—InGaAs layer 24 are about 800 nm, 1000 nm, 20 nm, and 250 nm, respectively. Further, the width of the contact layer 14 is 800 nm.

Figure 5:
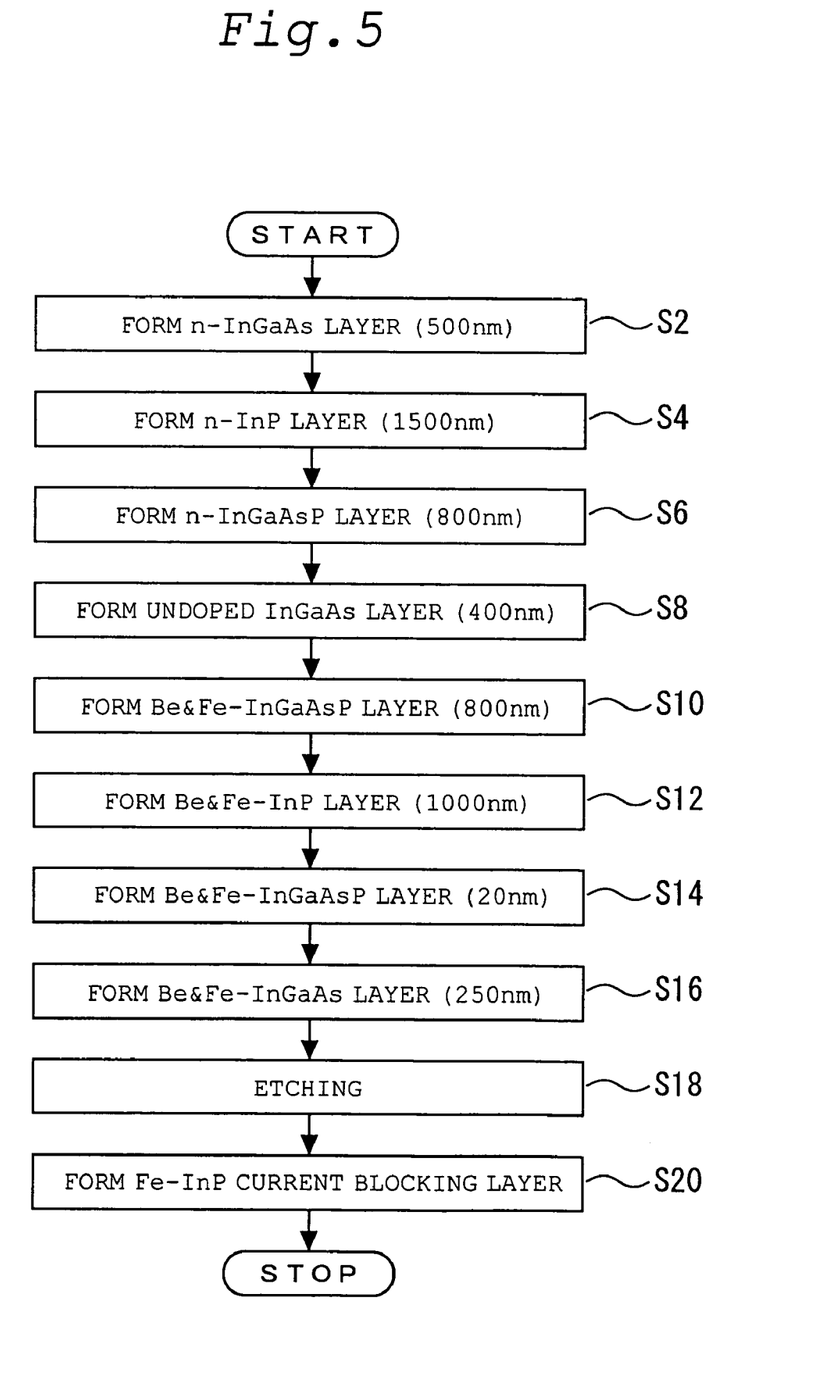
FIG. 5 is a flowchart for explaining a method of fabricating the optical semiconductor device in the first embodiment of the present invention.

FIG. 5 is a flowchart for explaining a method of fabricating the optical semiconductor device in the first embodiment of the present invention.

First, use is made of, as source material gases in the MOCVD method, $H_2S$ (hydrogen sulfide), $SiH_4$ (silane), $Si_2H_6$ (disilane), $AsH_3$ (arsine) for As and $PH_3$ (phosphine) for P as Group-V element dopants, TMG (trimethylgallium) or TEG (triethylgallium) for Ga and TMI (trimethylindium) or TEI (triethylindium) for In as organic metals, and so on. Further, $(MeCp)_2Be$ is used as a p-type dopant source material.

Specifically, proper materials are selected from these materials and, on the n-InP substrate 2, the n-InGaAs layer 4, the n-InP layer 6, and the n-InGaAsP layer 8 are stacked in the order named and further the InGaAs light absorbing layer 10 is formed (steps S2 to S8).

Then, the Be&Fe—InGaAsP layer 18, the Be&Fe—InP layer 20, the Be&Fe—InGaAsP layer 22, and the Be&Fe—InGaAs layer 24 are stacked (steps S10 to S16).

Here, in order to make the doping delay width of Be equal to 0.025 μm or less while maintaining the hole concentration in the Be&Fe—InP layer 20 at $1\times10^{18}/cm^3$, the supply amount of $(MeCp)_2Be$ is set to about 52.8 pmol/min. This amount is such an amount that causes the hole concentration to be $2.0\times10^{18}/cm^3$ with respect to InP when Be is doped alone. However, since, actually, Be is doped simultaneously with Fe, the hole concentration becomes $1\times10^{18}/cm^3$. On the other hand, the supply amount of $Cp_2Fe$ is kept constant in the range of 2±1 pmol/min.

It is understood from FIG. 1 that these supply amounts of $(MeCp)_2Be$ and $Cp_2Fe$ provide a Be doping delay width of 0.025 μm or less, which does not raise a problem on the operation characteristics of the optical device.

On the other hand, when, for example, setting the hole concentrations to $1\times10^{18}/cm^3$ or more with respect to the layers, other than the Be&Fe—InP layer 20, of the contact layer 14, the supply amounts of $(MeCp)_2Be$ are set to increased amounts more than usual, that correspond to those hole concentrations as above. In this event, the supply amounts of $Cp_2Fe$ are set in the range of 2±1 pmol/min. This is because since the interdiffusion of Be between the Fe—InP current blocking layers 16 and the contact layer 14 is suppressed if Fe exists in the contact layer 14 in advance, there is no problem as long as Fe is simultaneously doped with respect to the layers other than the Be&Fe—InP layer 20 regardless of concentrations thereof.

The simultaneous doping herein is similar to the conventional method. For example, when forming the Be&Fe—InP layer 20, use is made of, for example, a cylindrical chamber having a diameter of about 345 mm and a height of about 27 mm. Then, under the conditions of a film growth temperature of about 600° C., a growth rate of 2.5 μm/h, and a growth pressure of 100 mbar, TMI is supplied at a flow rate of 235.3 pmol/min and $PH_3$ at a flow rate of 1.339 pmol/min as material gases. Further, at the timing of starting growth of a semiconductor of a layer to be doped, $Cp_2Fe$ is supplied at a flow rate of 2±1 pmol/min and simultaneously $(MeCp)_2Be$ is supplied at a flow rate that provides a required hole concentration as above. In this manner, Fe can be simultaneously doped into the contact layer 14 formed by a p-type semiconductor doped with Be as a p-type dopant.

Thereafter, the InGaAs light absorbing layer 10 and the contact layer 14 are etched into a required shape (step S18). Then, the Fe—InP current blocking layers 16 are formed on both sides thereof (step S20). The Fe—InP current blocking layers are formed according to the MOCVD method in the same manner as conventional.

As described above, in the first embodiment, when using Be as a p-type dopant, Be and Fe are simultaneously doped. Here, the supply amounts of $(MeCp)_2Be$ and $Cp_2Fe$ are set so that doping delay of Be becomes 0.025 μm or less even when Fe is simultaneously doped. Therefore, even when Fe is simultaneously doped, Be being the p-type dopant can be sufficiently supplied into the respective layers 18 to 24 including the Be&Fe—InP layer 20. Accordingly, by doping Fe into the respective layers while maintaining the operation characteristics of the P-type semiconductor to be excellent, it is possible to suppress the interdiffusion of Be between the Fe—InP current blocking layers 16 and the contact layer 14. Consequently, it is possible to obtain the optical semiconductor device having the excellent device characteristics.

Although $(MeCp)_2Be$ is used for the Be doping in the first embodiment, solid Be is also available for dopant source. In this case, simultaneous doping of Be and Fe is carried out according to the MBE (Molecular Beam Epitaxy) method.

In the first embodiment, the description has been given of the case where the supply amount of $Cp_2Fe$ in the Be&Fe—InP layer 20 is kept constant in the range of 2±1 pmol/min. However, the present invention is not limited thereto and the supply amount thereof may be changed.

Figure 6:
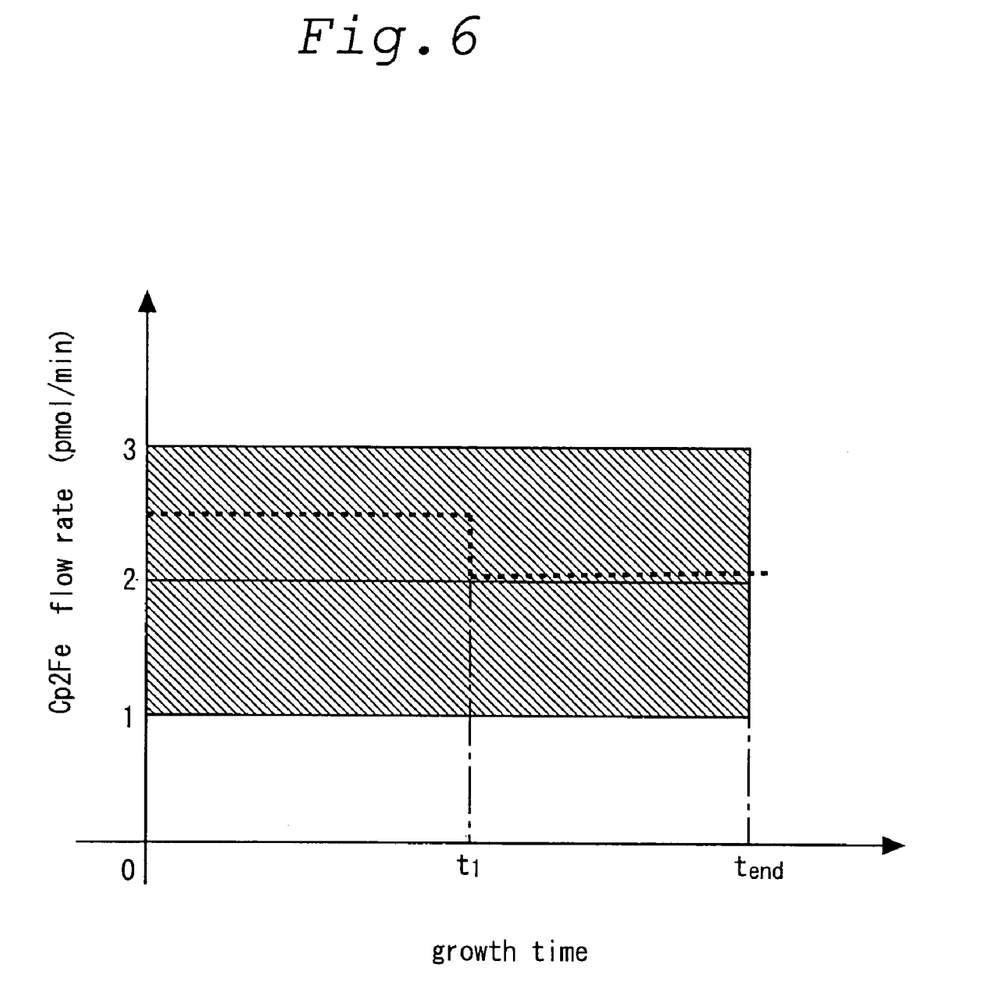
FIG. 6 is a graph for explaining one example of a supply amount of $Cp_2Fe$ in the method of fabricating the optical semiconductor device in the first embodiment of the present invention.

FIG. 6 is a graph for explaining another example of the supply amount of Fe during formation of the contact layer.

For example, in the case of FIG. 6, in order to maintain the Fe element concentration in the range of $2\times10^{16}/cm^3$ to $8\times10^{16}/cm^3$, $Cp_2Fe$ is supplied at a flow rate of about 2.5 pmol/min from the start of film formation to the lapse of a fixed time ($t_1$) and thereafter is supplied at a reduced flow rate of about 2.0 pmol/min until a film formation end time ($t_0$). In this manner, the supply amount of $Cp_2Fe$ may be changed within a range that maintains the Fe element concentration in the predetermined range. It is preferable that the supply amount of $Cp_2Fe$ be set in the range of 2±1 pmol/min.

In the first embodiment, the hole concentration has been described to be $1\times10^{18}/cm^3$. However, it is considered that this concentration includes an error of $\pm0.3\times10^{18}/cm^3$ expected in the fabrication.

In the first embodiment, for example, the n-InGaAs layer 4, the n-InP layer 6, and the n-InGaAsP layer 8 correspond to "an n-type semiconductor layer" of the present invention and the InGaAs light absorbing layer 10 corresponds to "an active layer" of the present invention. Further, the contact layer 14 corresponds to "a p-type semiconductor layer" of the present invention and the Fe—InP current blocking layers 16 correspond to "current blocking layers" of the present invention. However, the present invention is not necessarily limited to the structure described in the first embodiment but may have another structure within the scope of the present invention.

Further, in the first embodiment, for example, "an n-type semiconductor layer forming step" of the present invention is executed by executing steps S2 to S6, "an active layer forming step" of the present invention is executed by executing step S8, "a p-type semiconductor layer forming step" of the present invention is executed by executing steps S10 to S18, and "a current blocking layer forming step" of the present invention is executed by executing step S20.

Second Embodiment

Also in the second embodiment, Fe is simultaneously doped while maintaining the hole concentration of the Be&Fe—InP layer 20 in the contact layer 14 using Be as a p-type dopant to be $1 \times 10^{18}/cm^3$.

However, in the second embodiment, a supply amount X of $(MeCp)_2Be$ is set to 2 n times $X_0$ (pmol/min). Here, "$X_0$" represents a supply amount of $(MeCp)_2Be$ that can cause the hole concentration of the InP layer to be $1 \times 10^{18}/cm^3$ when Be is doped alone, and "n" represents an arbitrary positive integer number.

In this case, a supply amount Y of $Cp_2Fe$ is set as given by the following equation (1).

$$Y = 2 + (n-1) \pm 1 \text{ (pmol/min)} \quad (1)$$

That is, in the second embodiment, the supply amount Y of $Cp_2Fe$ in the case of simultaneous doping is changed depending on a change in supply amount X of $(MeCp)_2Be$ so that $Cp_2Fe$ is supplied in a proper amount.

When the supply amounts of $(MeCp)_2Be$ and $Cp_2Fe$ are set in this manner, it is possible to suppress doping delay and cause the hole concentration of the Be&Fe—InP layer 20 to be $1 \times 10^{18}/cm^3$ even if Be and Fe are simultaneously doped.

Third Embodiment

Also in the third embodiment, Be is used as a p-type dopant and Be and Fe are simultaneously supplied to the contact layer 14.

However, in the third embodiment, a description will be given of a case where the hole concentration of Be is caused to be $m \times 10^{18}/cm^3$. Here "m" represents an arbitrary positive rational number. This value of the hole concentration is considered to include an error of about $\pm 0.3 \times 10^{18}/cm^3$ expected in the fabrication. Also, in the third embodiment, Fe element concentration will be in the range of $2 \times 10^{16}/cm^3$ to $8 \times 10^{16}/cm^3$.

A supply amount X of $(MeCp)_2Be$ is set to 2 m times $X_0$. Here, $X_0$ represents a supply amount that can cause the hole concentration to be $1 \times 10^{18}/cm^3$ when Be is doped alone. On the other hand, the flow rate of $Cp_2Fe$ is set to $2 \pm 1$ pmol/min.

By setting the supply amount of $(MeCp)_2Be$ and the flow rate of $Cp_2Fe$ in this manner, the Fe element concentration can be kept in the range of $2 \times 10^{16}/cm^3$ to $8 \times 10^{16}/cm^3$, while ensuring a sufficient hole concentration of $m \times 10^{18}/cm^3$. Therefore, even when Be and Fe are simultaneously doped, a reduction in device resistance is enabled with a high hole concentration of the p-type semiconductor. Further, the interdiffusion between Fe of current blocking layers and Be of the contact layer to be suppressed regardless of the hole concentration.

The features and the advantages of the present invention as described above may be summarized as follows.

According to one aspect of the present invention, it is possible to simultaneously dope Fe and Be into a semiconductor by simultaneous doping. Therefore, even when Be is used as a dopant of a p-type semiconductor, interdiffusion between Fe of current blocking layers and Be can be effectively suppressed so that it is possible to obtain an optical semiconductor device having excellent operation characteristics.

Obviously many modifications and variations of the present invention are possible in the light of the above teachings. It is therefore to be understood that within the scope of the appended claims the invention may by practiced otherwise than as specifically described.

The entire disclosure of a Japanese Patents Application No. 2004-267033, filed on Sep. 14, 2005 including specification, claims, drawings and summary, on which the Convention priority of the present application is based, are incorporated herein by reference in its entirety.

What is claimed is:

1. An optical semiconductor device comprising:
    an n-type semiconductor layer having n-type conductivity;
    an active layer on said n-type semiconductor layer;
    a p-type semiconductor layer having p-type conductivity and on said active layer; and
    current blocking layers doped with Fe and located on opposite sides of said p-type semiconductor layer, wherein said p-type semiconductor layer is doped with Fe and Be and has a hole concentration in a range from $0.7 \times 10^{18}/cm^3$ to $1.3 \times 10^{18}/cm^3$ and an Fe concentration in a range from $2 \times 10^{16}$ to $8 \times 10^{16}/cm^3$.

2. An optical semiconductor device fabrication method comprising:
    forming an n-type semiconductor layer;
    forming an active layer on said n-type semiconductor layer;
    forming a p-type semiconductor layer doped with Fe and Be on said active layer; and
    forming current blocking layers on opposite sides of said p-type semiconductor layer, wherein, in forming said p-type semiconductor layer, simultaneously doping said p-type semiconductor layer with Be and Fe, by supplying a source material providing Be at a rate producing a hole concentration in said p-type semiconductor layer larger than a hole concentration produced when said source material providing Be is supplied alone in growing said p-type semiconductor layer.

3. The optical semiconductor device fabrication method according to claim 2, including, in forming said p-type semiconductor layer, supplying said source material providing Be at a rate 2 n times the rate producing a hole concentration in said p-type semiconductor layer in a range from $0.7 \times 10^{18}/cm^3$ to $1.3 \times 10^{18}/cm^3$ when said source material providing Be is supplied alone, and supplying a source material providing Fe at a rate $2 + ((n-1) \pm 1)$ pmol/min.

4. The optical semiconductor device fabrication method according to claim 2, including, in forming said p-type semiconductor layer, supplying a source material providing Fe at a rate of $2 \pm 1$ pmol/min, and supplying said source material providing Be at a rate to produce a hole concentration in said p-type semiconductor layer of $(m \pm -0.3) \times 10^{18}/cm^3$, at a rate 2 m times the rate that produces a hole concentration in said p-type semiconductor layer of $1 \times 10^{18}/cm^3$ when said source material providing Be is supplied alone.

5. The optical semiconductor device fabrication method according to claim 2, including, in forming said p-type semiconductor layer, continuing to supply at a constant rate a source material providing Fe so that Fe concentration in said p-type semiconductor layer falls within a range from $2\times10^{16}$ to $8\times10^{16}/cm^3$.

6. The optical semiconductor device fabrication method according to claim 2, including, in forming said p-type semiconductor layer, adjusting supply rate of a source material providing Fe so that Fe concentration in said p-type semiconductor layer falls within a range from $2\times10^{16}$ to $8\times10^{16}/cm^3$.

7. The optical semiconductor device fabrication method according to claim 2, wherein $(MeCp)_2Be$ is the source material providing Be.

* * * * *